United States Patent
Jin et al.

(10) Patent No.: US 11,495,564 B2
(45) Date of Patent: Nov. 8, 2022

(54) ELECTRONIC-PART-REINFORCING THERMOSETTING RESIN COMPOSITION, SEMICONDUCTOR DEVICE, AND METHOD FOR FABRICATING THE SEMICONDUCTOR DEVICE

(71) Applicant: Panasonic Intellectual Property Management Co., Ltd., Osaka (JP)

(72) Inventors: Jin Jin, Osaka (JP); Atsushi Yamaguchi, Osaka (JP); Yasuo Fukuhara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/057,989

(22) PCT Filed: May 24, 2019

(86) PCT No.: PCT/JP2019/020612
§ 371 (c)(1),
(2) Date: Nov. 23, 2020

(87) PCT Pub. No.: WO2019/225733
PCT Pub. Date: Nov. 28, 2019

(65) Prior Publication Data
US 2021/0202421 A1 Jul. 1, 2021

(30) Foreign Application Priority Data
May 25, 2018 (JP) ................ JP2018-100988

(51) Int. Cl.
*H01L 23/00* (2006.01)

(52) U.S. Cl.
CPC .............. *H01L 24/13* (2013.01); *H01L 24/11* (2013.01); *H01L 24/29* (2013.01); *H01L 24/73* (2013.01);
(Continued)

(58) Field of Classification Search
CPC ...................................... H01L 24/13
See application file for complete search history.

(56) References Cited

U.S. PATENT DOCUMENTS

2003/0080397 A1* 5/2003 Sakuyama .......... H01L 24/29
257/667

FOREIGN PATENT DOCUMENTS

| JP | 2010-171118 | 8/2010 |
| JP | 2013-219286 | 10/2013 |

(Continued)

OTHER PUBLICATIONS

Official Communication issued in International Patent Application No. PCT/JP2019/020612, dated Jul. 16, 2019, along with an English translation thereof.

*Primary Examiner* — William A Harriston
(74) *Attorney, Agent, or Firm* — Greenblum & Bernstein, P.L.C.

(57) ABSTRACT

An electronic-part-reinforcing thermosetting resin composition has: a viscosity of 5 Pa·s or less at 140° C.; a temperature of 150° C. to 170° C. as a temperature corresponding to a maximum peak of an exothermic curve representing a curing reaction; and a difference of 20° C. or less between the temperature corresponding to the maximum peak and a temperature corresponding to one half of the height of the maximum peak in a temperature rising range of the exothermic curve.

8 Claims, 4 Drawing Sheets

(52) U.S. Cl.
CPC .............. *H01L 24/81* (2013.01); *H01L 24/83* (2013.01); *H01L 24/91* (2013.01); *H01L 2224/11013* (2013.01); *H01L 2224/1369* (2013.01); *H01L 2224/2919* (2013.01); *H01L 2224/73204* (2013.01); *H01L 2224/81007* (2013.01); *H01L 2224/83862* (2013.01); *H01L 2224/9211* (2013.01)

(56) References Cited

FOREIGN PATENT DOCUMENTS

| | | |
|---|---|---|
| JP | 2014-237811 | 12/2014 |
| JP | 2017-014454 | 1/2017 |
| JP | 2017-071705 | 4/2017 |
| JP | 2017-188306 | 10/2017 |
| JP | 2017-197688 | 11/2017 |
| JP | 2018-039981 | 3/2018 |
| JP | 2018-022819 | 2/2019 |

\* cited by examiner

ELECTRONIC-PART-REINFORCING THERMOSETTING RESIN COMPOSITION, SEMICONDUCTOR DEVICE, AND METHOD FOR FABRICATING THE SEMICONDUCTOR DEVICE

CROSS-REFERENCE TO RELATED APPLICATIONS

This application is a National Stage of International Application No. PCT/JP2019/020612 filed May 24, 2019, which claims priority to Japanese Patent Application No. 2018-100988 filed on May 25, 2018, the contents of each noted application is hereby incorporated by reference in its entirety.

TECHNICAL FIELD

The present invention generally relates to an electronic-part-reinforcing thermosetting resin composition, a semiconductor device, and a method for fabricating the semiconductor device, and more particularly relates to an electronic-part-reinforcing thermosetting resin composition which may be used to make a reinforcing member for a semiconductor device, a semiconductor device reinforced with the electronic-part-reinforcing thermosetting resin composition, and a method for fabricating a semiconductor device using the electronic-part-reinforcing thermosetting resin composition.

BACKGROUND ART

When a flip-chip bonding type semiconductor chip is surface-mounted onto a base member, a reinforcing member is sometimes placed between the semiconductor chip and the base member. The reinforcing member allows a point of contact between a bump electrode of the semiconductor chip and conductor wiring on the base member to be protected and also allows the bump electrode to be reinforced.

For example, Patent Literature 1 teaches, when mounting a flip-chip bonding type surface-mount part with a bump electrode onto a circuit board with a mount electrode, applying an underfilling liquid curable resin composition onto at least one of a surface where the mount electrode is formed or a surface where the bump electrode is formed so as not to cover the electrode, placing a surface-mount part onto the circuit board such that the bump electrode faces the mount electrode, and then performing a reflow process to bond the bump electrode and the mount electrode together and cure the liquid curable resin composition.

To mount a semiconductor chip onto a base member and to form a reinforcing member by curing a liquid curable resin composition between the semiconductor chip and the base member, a semiconductor device being fabricated is subjected to a heating treatment such as the reflow process. In that case, the semiconductor device thus obtained may have some warpage due to a difference in thermal expansion coefficient between the semiconductor chip, the base member, and the reinforcing member. The degree of warpage is certainly reducible by lowering the heating temperature at the time of the heating treatment. However, if the heating temperature is low, then the liquid curable resin composition may be cured insufficiently or the degree of wettability between the liquid curable resin composition and the bump electrode may decrease too much to allow the reinforcing member to reinforce the bump electrode sufficiently.

CITATION LIST

Patent Literature

Patent Literature 1: JP 2010-171118 A

SUMMARY OF INVENTION

The problem to be overcome by the present invention to provide: i) an electronic-part-reinforcing thermosetting resin composition which is curable quickly even when subjected to a heating treatment at the highest heating temperature of 200° C. or less while a reinforcing member for a semiconductor device is being formed and which tends to exhibit good wettability between the thermosetting resin itself and a bump electrode; ii) a semiconductor device including a reinforcing member made of the electronic-part-reinforcing thermosetting resin composition; and iii) a method for fabricating a semiconductor device using the electronic-part-reinforcing thermosetting resin composition.

An electronic-part-reinforcing thermosetting resin composition according to an aspect of the present invention has: a viscosity of 5 Pa·s or less at 140° C.; a temperature of 150° C. to 170° C. as a temperature corresponding to a maximum peak of an exothermic curve representing a curing reaction; and a difference of 20° C. or less between the temperature corresponding to the maximum peak and a temperature corresponding to one half of the height of the maximum peak in a temperature rising range of the exothermic curve.

A semiconductor device according to another aspect of the present invention includes: a base member including conductor wiring; a semiconductor chip including a bump electrode, the semiconductor chip being mounted on the base member by having the bump electrode bonded onto the conductor wiring; and a reinforcing member covering the bump electrode. The reinforcing member is a cured product of the electronic-part-reinforcing thermosetting resin composition described above.

A method for fabricating a semiconductor device according to still another aspect of the present invention includes: providing a base member including conductor wiring and a semiconductor chip including a bump electrode; placing the semiconductor chip over the base member and placing the bump electrode on the conductor wiring; arranging the electronic-part-reinforcing thermosetting resin composition described above such that the electronic-part-reinforcing thermosetting resin composition covers the bump electrode; and subjecting the electronic-part-reinforcing thermosetting resin composition and the bump electrode to heating treatment and thereby curing the electronic-part-reinforcing thermosetting resin composition to form a reinforcing member and electrically connect the bump electrode and the conductor wiring together.

DESCRIPTION OF EMBODIMENTS

An exemplary embodiment of the present invention will now be described.

An electronic-part-reinforcing thermosetting resin composition (hereinafter also referred to as "Composition (X)") according to an exemplary embodiment is used to make a reinforcing member 4 for a semiconductor device 1 (see FIGS. 1A-1C and FIGS. 2A and 2B).

The Composition (X) has the properties of having a viscosity of 5 Pa·s or less at 140° C., having a temperature of 150° C. to 170° C. as a temperature corresponding to a maximum peak of an exothermic curve representing a curing reaction; and having a difference of 20° C. or less between the temperature corresponding to the maximum peak and a temperature corresponding to one half of the height of the maximum peak in a temperature rising range of the exothermic curve. As used herein, the "temperature rising range of the exothermic curve" refers to a low-temperature range located on the low-temperature side with respect to the maximum peak of the exothermic curve.

The temperature corresponding to one half of the height of the maximum peak in the temperature rising range of the exothermic curve more suitably falls within the range from 140° C. to 168° C., and even more suitably falls within the range from 150° C. to 160° C.

The viscosity at 140° C. of the Composition (X) may be measured with a rheometer under the condition including a rotational velocity of 5 rpm.

The temperature corresponding to the maximum peak of the exothermic curve of the Composition (X) and the temperature corresponding to one half of the height of the maximum peak in the temperature rising range of the exothermic curve may be determined based on a differential scanning calorimetry (DSC) curve obtained by performing a DSC on the Composition (X) within the air atmosphere under the condition including a temperature falling within the range from 30° C. to 300° C. and a temperature increase rate of 10° C./min. The DSC curve is a curve plotted on a graph, of which the ordinate indicates a heat flow and the abscissa indicates the temperature. An exemplary DSC curve is shown in FIG. 4.

Figure 4:
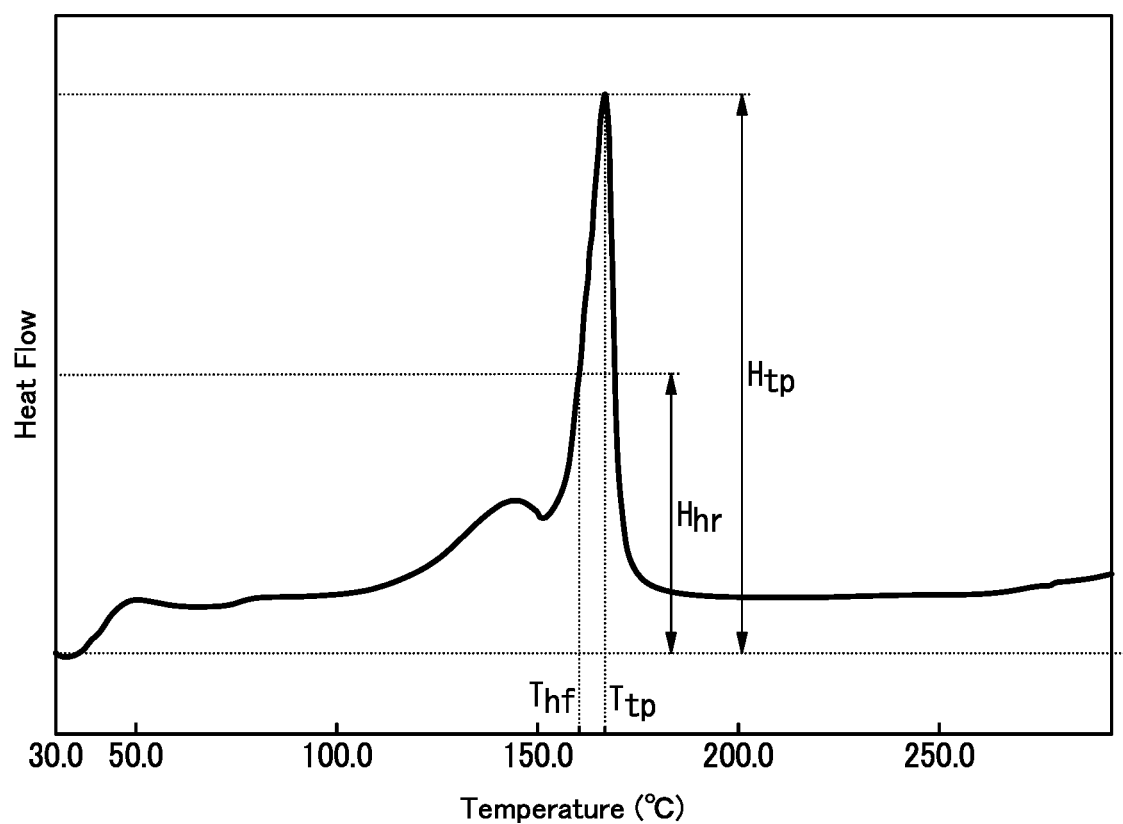
FIG. 4 is a graph showing an exemplary DSC curve obtained by performing a differential scanning calorimetry (DSC) on the electronic-part-reinforcing thermosetting resin composition.

The temperature $T_{tp}$ corresponding to the maximum peak of the exothermic curve is a temperature at which the maximum peak of the exothermic curve appears on the DSC curve as shown in FIG. 4.

The temperature $T_{hf}$ corresponding to one half of the height of the maximum peak in the temperature rising range of the exothermic curve is a temperature which is lower than the temperature $T_{tp}$ corresponding to the maximum peak and at which a height $H_{hf}$ that is one half of the height $H_{tp}$ of the maximum peak of the exothermic curve appears as shown in FIG. 4. That is to say, $H_{tp}$ and $H_{hf}$ satisfy $H_{tp}/2=H_{hf}$. Note that these heights $H_{tp}$ and $H_{hf}$ are determined based on an initial value of the DSC curve, i.e., point at 30° C. on the DSC curve.

The difference $(T_{tp}-T_{hf})$ between the temperatures $T_{tp}$ and $T_{hf}$ is 20° C. or less as described above. This difference $(T_{tp}-T_{hf})$ is more suitably 15° C. or less, and even more suitably 10° C. or less.

According to this embodiment, making the reinforcing member 4 for the semiconductor device 1 of the Composition (X) allows the reinforcing member 4 to be cured quickly even through a heating treatment at the highest heating temperature of 200° C. or less and also allows the reinforcing member 4 to exhibit good wettability with the bump electrodes 33. This allows the reinforcing member 4 to sufficiently reinforce the bump electrodes 33 of the semiconductor chip 3. In this embodiment, particularly beneficial advantages are achieved when the highest heating temperature is 200° C. or less as described above. However, this should not be construed as limiting and does not prevent the highest heating temperature of the heating treatment from being set at a temperature higher than 200° C.

These advantages are achieved probably for the following reasons.

In this embodiment, to form the reinforcing member 4 by heating and curing the Composition (X), first, the Composition (X) has its viscosity decreased as the temperature rises, and then the curing reaction of the Composition (X) advances. While the Composition (X) is decreasing its viscosity, the Composition (X) tends to exhibit good wettability with respect to the bump electrodes 33 of the semiconductor chip 3 because the viscosity at 140° C. of the Composition (X) is 5 Pa·s or less. Thus, even if the bump electrodes 33 are deformed under heat, the Composition (X) tends to flow easily to follow the deformation. That is to say, the Composition (X) is able to exhibit good wettability during the heating treatment with respect to the bump electrodes 33. In addition, even if there are any voids in the Composition (X), those voids are easily exhausted from the Composition (X). This reduces the chances of the voids remaining in the reinforcing member 4. Furthermore, the temperature corresponding to the maximum peak of the exothermic curve representing the curing reaction of the Composition (X) falls within the range from 150° C. to 170° C. and the difference between the temperature corresponding to the maximum peak and the temperature corresponding to one half of the height of the maximum peak in the temperature rising range of the exothermic curve is equal to or less than 20° C. This allows, even if the heating treatment is conducted at the highest heating temperature of 200° C. or less, the curing reaction of the Composition (X) to advance quickly after the Composition (X) has decreased its viscosity. This allows the Composition (X) to be cured sufficiently while decreasing the heating temperature and shortening the heating time during the heating treatment. Consequently, this reduces the chances of the semiconductor device 1 having warpage due to a difference in thermal expansion coefficient between the semiconductor chip 3, the base member 2, and the reinforcing member 4. In addition, this also reduces the chances of applying load to the semiconductor chip 3 due to the heat.

The Composition (X), having such properties, suitably turns into a cured product with a curing rate of 60% or more when subjected to the heating treatment under at least one condition that the highest heating temperature falls within the range from 160° C. to 200° C. and a total of time periods in which the heating temperature is equal to or higher than 160° C. is within the range from 40 seconds to 10 minutes.

The curing rate (Hr) of the cured product is given by the equation Hr={$(Cv_0-Cv_1)/Cv_0$}×100(%), where $Cv_1$ is the quantity of heat generated by the cured product obtained by performing a differential scanning calorimetry (DSC) on the cured product within the air atmosphere at a temperature falling within the range from 30° C. to 200° C. and at a temperature increase rate of 10° C./min and $Cv_0$ is the quantity of heat generated by the Composition (X) obtained by performing a differential scanning calorimetry (DSC) on the Composition (X) within the air atmosphere at a temperature falling within the range from 30° C. to 300° C. and at a temperature increase rate of 10° C./min.

The Composition (X) more suitably turns into a cured product with a curing rate of 70% or more when subjected to the heating treatment under at least one condition that the highest heating temperature falls within the range from 160° C. to 200° C. and a total of time periods in which the heating temperature is equal to or higher than 160° C. is within the range from 40 seconds to 10 minutes. The Composition (X) even more suitably turns into a cured product with a curing rate of 65% or more, and particularly suitably turns into a cured product with a curing rate of 70% or more, when subjected to the heating treatment under the condition that the highest heating temperature is any temperature within the range from 160° C. to 170° C. and a total of time periods in which the heating temperature is equal to or higher than 160° C. is any time within the range from 1 minute to 2 minutes.

The Composition (X) even more suitably turns into a cured product with a curing rate of 60% or more, and particularly suitably turns into a cured product with a curing rate of 70% or more, when subjected to the heating treatment under the condition that the highest heating temperature is 165° C. and a total of time periods in which the heating temperature is equal to or higher than 160° C. is 1 minute.

Next, it will be described what chemical makeup the Composition (X) suitably has to exhibit such properties.

The Composition (X) is suitably in liquid phase at ordinary temperature. As used herein, to be "in liquid phase at ordinary temperature" means having flowability at 18° C. under the atmospheric pressure. In particular, the Composition (X) suitably exhibits flowability at any temperature falling within the range from 5° C. to 28° C. under the atmospheric pressure.

The Composition (X) may contain a thermosetting resin, for example. The thermosetting resin contains at least one resin selected from the group consisting of, for example, phenolic resins, epoxy resins, bismaleimide resins, and cyanate resins.

The Composition (X) may contain, for example, an epoxy resin and a curing agent reacting to the epoxy resin.

The epoxy resin contains, for example, at least one resin selected from the group consisting of a bisphenol A type epoxy resin, a bisphenol F type epoxy resin, a biphenyl type epoxy resin, a naphthalene type epoxy resin, a cresol novolac type epoxy resin, and a phenol novolac type epoxy resin. The curing agent contains, for example, at least one compound selected from the group consisting of phenolic curing agents, acid anhydride curing agents, amine curing agents, mercaptan curing agents, and imidazole curing agents.

Among other things, the epoxy resin particularly suitably contains a bisphenol type epoxy resin which is in liquid phase at 25° C. (hereinafter also referred to as a "liquid bisphenol type epoxy resin (a1)"). The curing agent suitably includes at least one compound selected from the group consisting of: 2-phenyl-4-hydroxymethyl-5-methylimidazole; 2-phenyl-4,5-dihydroxymethylimidazole; and 2,4-diamino-6-(2'-ethyl-4'-methylimidazol)-ethyl-s-triazine. That is to say, the Composition (X) suitably contains: the liquid bisphenol type epoxy resin (a1); and component (b) that is at least one compound selected from the group consisting of 2-phenyl-4-hydroxymethyl-5-methylimidazole, 2-phenyl-4, 5-dihydroxymethyl imidazole, and 2,4-diamino-6-(2'-ethyl-4'-methylimidazole)-ethyl-s-triazine.

Having the Composition (X) contain the liquid bisphenol type epoxy resin (a1) increases the chances of the Composition (X) having a viscosity of 5 Pa·s or less at 140° C. and also increases the chances of the reinforcing member 4 having high strength. The liquid bisphenol type epoxy resin (a1) may contain, for example, at least one component selected from the group consisting of a bisphenol A type epoxy resin and a bisphenol F type epoxy resin.

The liquid bisphenol type epoxy resin (a1) suitably has an average molecular weight of 100 to 10,000. If the average molecular weight of the liquid bisphenol type epoxy resin (a1) is 3,000 or less, the liquid bisphenol type epoxy resin (a1) contributes to decreasing the viscosity of the Composition (X) at 140° C. particularly effectively, thus achieving a viscosity of 5 Pa·s or less especially easily. The average molecular weight of the liquid bisphenol type epoxy resin (a1) is particularly suitably 1,000 or less.

The epoxy resin in the Composition (X) may contain additional resins other than the liquid bisphenol type epoxy resin (a1). In that case, the ratio by mass of the liquid bisphenol type epoxy resin (a1) to the entire epoxy resin is suitably equal to or larger than ½ and more suitably falls within the range from ⅔ to 15/16.

The epoxy resin may contain a solid epoxy resin (a2) as well as the liquid bisphenol type epoxy resin (a1). That is to say, the Composition (X) may further contain the solid epoxy resin (a2). In that case, the solid epoxy resin (a2) allows the properties of the Composition (X) and the reinforcing member 4 to be adjusted. The solid epoxy resin (a2) is suitably compatible with the liquid bisphenol type epoxy resin (a1). In this case, the solid epoxy resin (a2) would not cause an increase in the viscosity of the Composition (X). The solid epoxy resin (a2) is suitably compatible with the liquid bisphenol type epoxy resin (a1) at ordinary temperature. The solid epoxy resin (a2) is also suitably compatible with the liquid bisphenol type epoxy resin (a1) under the heat (specifically, at a temperature of 120° C., for example).

The solid epoxy resin (a2) suitably has a biphenyl skeleton. In that case, the solid epoxy resin (a2) contributes to raising the glass transition temperature of the reinforcing member 4, and therefore, contributes to improving the thermal resistance of the reinforcing member 4. The solid epoxy resin (a2) contains at least one resin selected from the group consisting of a biphenyl type epoxy resin and a biphenyl aralkyl type epoxy resin.

The solid epoxy resin (a2) suitably has no crystallinity. Thus, the solid epoxy resin (a2) suitably includes a biphenyl aralkyl type epoxy resin, out of the group consisting of a biphenyl type epoxy resin and a biphenyl aralkyl type epoxy resin. This allows the Composition (X) to exhibit particularly good wettability with respect to the bump electrodes 33.

When the epoxy resin contains the solid epoxy resin (a2), the ratio by mass of the liquid bisphenol type epoxy resin (a1) to the solid epoxy resin (a2) suitably falls within the range from 1:1 to 30:1. This significantly increases the chances of decreasing the viscosity of the Composition (X) and imparting properties derived from the solid epoxy resin (a2) to the Composition (X) and the reinforcing member 4. This ratio by mass more suitably falls within the range from 2:1 to 16:1 and even more suitably falls within the range from 2:1 to 14:1.

The Composition's (X) component (b), which includes at least one compound selected from the group consisting of 2-phenyl-4-hydroxymethyl-5-methylimidazole and 2,4-diamino-6-(2'-ethyl-4'-methylimidazol)-ethyl-s-triazine, contributes to lowering the curing start temperature of the Composition (X) and quickly advancing the curing reaction of the Composition (X). Thus, the component (b) increases the chances of achieving the properties that the temperature corresponding to the maximum peak of the exothermic curve representing the curing reaction falls within the range from 150° C. to 170° C. and the difference between the temperature corresponding to the maximum peak and the temperature corresponding to one half of the height of the maximum peak in the temperature rising range of the exothermic curve is 20° C. or less.

The ratio by mass of the component (b) to the entire epoxy resin in the Composition (X) suitably falls within the range from 0.05 to 0.5. This allows the component (b) to impart the properties described above to the Composition (X) particularly easily. The ratio by mass of the component (b) more suitably falls within the range from 0.10 to 0.30.

The curing agent in the Composition (X) suitably contains only the component (b) but may further contain other compounds in addition to the component (b). If the curing agent contains such additional compounds other than the component (b), then the content of the component (b) to the entire curing agent is suitably 80% by mass or more.

The Composition (X) may further contain a curing accelerator. The curing accelerator contains, for example, at least one compound selected from the group consisting of amine-based curing accelerators, polyamide-based curing accelerators, and Lewis acid-based curing accelerators. The curing accelerator may contain a latent curing accelerator.

The Composition (X) suitably contains a flux. The flux is a component having the capability of removing, by reduction, for example, a metal oxide from the surface of a metal. Having the Composition (X) contain a flux allows the flux to remove a metal oxide more easily from the surface of the bump electrodes 33 and from the surface of the conductor wiring 21, thus increasing the wettability between the bump electrodes 33 and the conductor wiring 21 to maintain electrical continuity between the bump electrodes 33 and the conductor wiring 21 more easily.

The flux may contain an organic acid, for example. The organic acid may contain one or more compounds selected from the group consisting of abietic acid, glutaric acid, succinic acid, malonic acid, oxalic acid, adipic acid, pimelic acid, suberic acid, azelaic acid, diglycolic acid, thiodiglycolic acid, phthalic acid, isophthalic acid, terephthalic acid, propanetricarboxylic acid, citric acid, benzoic acid, and tartaric acid. Among other things, to significantly increase the wettability between the bump electrodes 33 and the conductor wiring 21, the organic acid suitably contains one or more compounds selected from the group consisting of abietic acid, glutaric acid, oxalic acid, and benzoic acid.

The ratio by mass of the flux to the entire thermosetting resin in the Composition (X) suitably falls within the range from 0.03 to 0.40. That is to say, if the thermosetting resin is an epoxy resin, then the ratio by mass of the flux to the entire epoxy resin in the Composition (X) falls within the range from 0.03 to 0.40. This allows the flux to increase the wettability between the bump electrodes 33 and the conductor wiring 21 particularly significantly. In addition, this also reduces the chances of the flux making the reinforcing member 4 brittle or causing a decline in the insulation reliability of the reinforcing member 4. Besides, this also reduces the chances of the flux bleeding from the reinforcing member 4. The ratio by mass of the flux more suitably falls within the range from 0.06 to 0.15.

The Composition (X) may contain a filler but suitably contains no fillers. If the Composition (X) contains a filler, the content of the filler to the entire Composition (X) is suitably greater than 0% by mass and equal to or less than 5% by mass. Having the Composition (X) contain no fillers or setting the content of the filler therein at a value greater than 0% by mass and equal to or less than 5% by mass significantly reduces the number of, or even eliminates, filler particles in the gap between the bump electrodes 33 and the conductor wiring 21 even when the reinforcing member 4 covers the seam (or the gap) between the bump electrodes 33 of the semiconductor chip 3 and the conductor wiring 21 of the base member 2. This significantly reduces, or even eliminates, conduction failure in the semiconductor device 1 due to the fillers.

Note that particularly if the reinforcing member 4 is used as an underfilling material, a filler may be used to reduce the warpage of the semiconductor device 1 by adjusting the linear expansion coefficient of the reinforcing member 4. In this embodiment, however, the Composition (X) has the properties described above. This reduces, even if the Composition (X) contains no fillers or if the content of the fillers therein is greater than 0% by mass and equal to or less than 5% by mass, the chances of the semiconductor device 1 having warpage.

If the Composition (X) contains a filler, then the filler may contain at least one material selected from the group consisting of: silica powders such as fused silica, synthetic silica, and crystalline silica; oxides such as alumina and titanium oxide; silicates such as talc, fired clay, unfired clay, mica, and glass; carbonates such as calcium carbonate, magnesium carbonate, and hydrotalcite; hydroxides such as aluminum hydroxide, magnesium hydroxide, and calcium hydroxide; sulfates or sulfites such as barium sulfate, calcium sulfate, and calcium sulfite; borates such as zinc borate, barium metaborate, aluminum borate, calcium borate, and sodium borate; and nitrides such as aluminum nitride, boron nitride, and silicon nitride. The fused silica may be fused spherical silica or fused crushed silica, whichever is appropriate.

Optionally, the Composition (X) may further contain, as needed, at least one additive selected from the group consisting of: a dispersion stabilizer, a flame retardant, a low elasticity agent, an adhesion imparting agent, a thixotropic property imparting agent, a colorant, a diluent, an antifoaming agent, a coupling agent, and an organic solvent, as long as the properties of the Composition (X) are not significantly affected.

Next, a semiconductor device 1 and a method for fabricating the semiconductor device 1 will be described.

The semiconductor device 1 includes: a base member 2 including conductor wiring 21; a semiconductor chip 3 including bump electrodes 33 and mounted onto the base member 2 by having the bump electrodes 33 bonded onto the conductor wiring 21; and a reinforcing member 4 covering the bump electrodes 33. The reinforcing member 4 is a cured product of the Composition (X).

The base member 2 may be a motherboard, a package board, or an interposer board, for example. In this embodiment, the base member 2 includes an insulating substrate made of glass epoxy, polyimide, polyester, a ceramic, or any other suitable material and conductor wiring 21 made of an electrical conductor such as copper and formed on its surface. The conductor wiring 21 includes electrode pads, for example.

The semiconductor chip 3 may be a flip-chip bonded chip such as a ball-grid array (BGA), land-grid array (LGA), or chip size package (CSP) chip. Alternatively, the semiconductor chip 3 may also be a package on package (PoP) chip.

The semiconductor chip 3 includes a plurality of bump electrodes 33. Each of the bump electrodes 33 includes solder. As shown in FIGS. 1A-1C and FIGS. 2A and 2B, each bump electrode 33 includes a pillar 31 and a solder bump 32 provided at the tip of the pillar 31. The solder bump 32 is made of solder, and therefore, each bump electrode 33 includes solder. The pillar 31 may be made of copper, for example.

The solder contained in each bump electrode 33 (e.g., the solder of the solder bump 32 thereof) suitably has a melting point of 180° C. or less, more suitably 170° C. or less. Using solder having a melting point of 180° C. or less or 170° C. or less increases the chances of establishing electrical connection between the bump electrodes 33 and the conductor wiring 21 while lowering the heating temperature at the time of the heating treatment for making the reinforcing member 4 of the Composition (X). Also, the solder may have a melting point of at least 130° C., for example, more suitably 140° C. or more.

The solder is suitably Sn—Bi based solder, among other things. The Sn—Bi based solder may contain, for example, 40% by mass to 42% by mass of Sn and 58% by mass to 60% by mass of Bi. The Sn—Bi based solder may contain not only Sn and Bi but also at least one material selected from the group consisting of Ag, Ni, Fe, Ge, Cu, and In. To improve the mechanical performance of the Sn—Bi based solder, the Sn—Bi solder suitably contains at least one material selected from the group consisting of Ag, Ni, Fe, and Ge.

Note that the bump electrode 33 including solder does not have to have the structure described above but may include only a spherical solder bump 32 (solder ball). That is to say, the bump electrode 33 does not have to include the pillar.

The reinforcing member 4 needs to cover the respective bump electrodes 33 at least partially. The reinforcing member 4 more suitably covers the respective bump electrodes 33 entirely. The reinforcing member 4 is able to reinforce the bump electrodes 33 by covering the bump electrodes 33. In particular, the reinforcing member 4 suitably covers the seam between the bump electrodes 33 and the conductor wiring 21. This allows the reinforcing member 4 to reduce the chances of the bump electrodes 33 being disconnected from the conductor wiring 21.

The reinforcing member 4 may have any shape as long as the reinforcing member 4 covers the bump electrodes 33 as described above. Specific exemplary shapes of the reinforcing member 4 are shown in FIGS. 1A-1C and FIGS. 2A and 2B. In each of the examples illustrated in FIGS. 1A-1C and FIGS. 2A and 2B, the reinforcing member 4 is arranged in the gap between the base member 2 and the semiconductor chip 3.

Figure 1A:
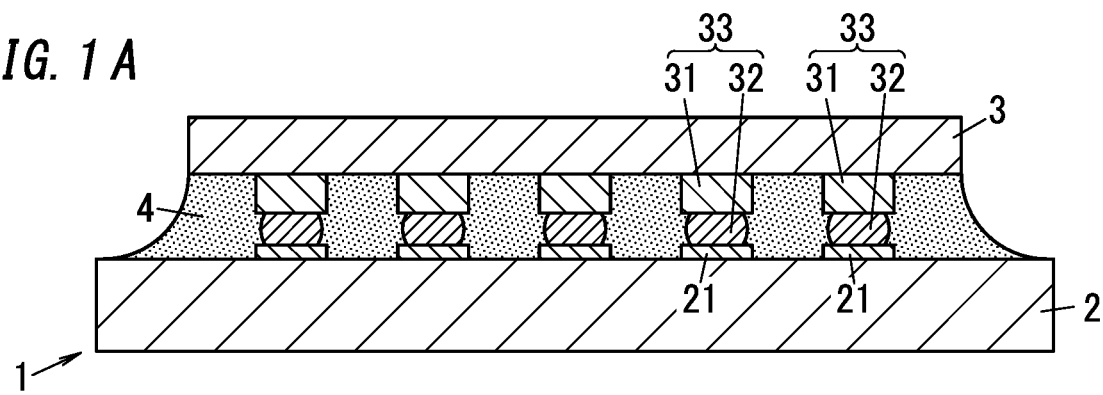
FIG. 1A is a cross-sectional view schematically illustrating a first example of a semiconductor device according to an exemplary embodiment of the present invention.

In the first example illustrated in FIG. 1A, the reinforcing member 4 fills the gap between the base member 2 and the semiconductor chip 3 entirely. This allows the reinforcing member 4 to cover the bump electrodes 33 entirely and also cover the seam between the bump electrodes 33 and the conductor wiring 21. This reinforcing member 4 is a so-called "underfilling material."

Meanwhile, in each of the examples illustrated in FIGS. 1B, 1C, 2A, and 2B, the reinforcing member 4 fills the gap between the base member 2 and the semiconductor chip 3 only partially.

Figure 1B:
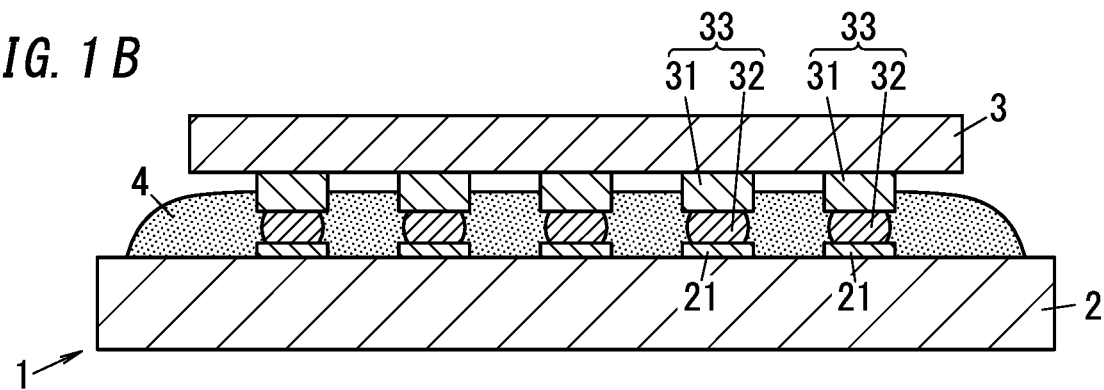
FIG. 1B is a cross-sectional view schematically illustrating a second example of a semiconductor device according to the exemplary embodiment of the present invention.

In the second example illustrated in FIG. 1B, the reinforcing member 4 is arranged on the base member 2 and a gap is left between the reinforcing member 4 and the semiconductor chip 3. The reinforcing member 4 covers the conductor wiring 21 entirely and also covers the part, bonded to the conductor wiring 21, of each bump electrode 33. This allows the base member 2 to cover the bump electrodes 33 partially and also cover the seam between the bump electrodes 33 and the conductor wiring 21.

Figure 1C:
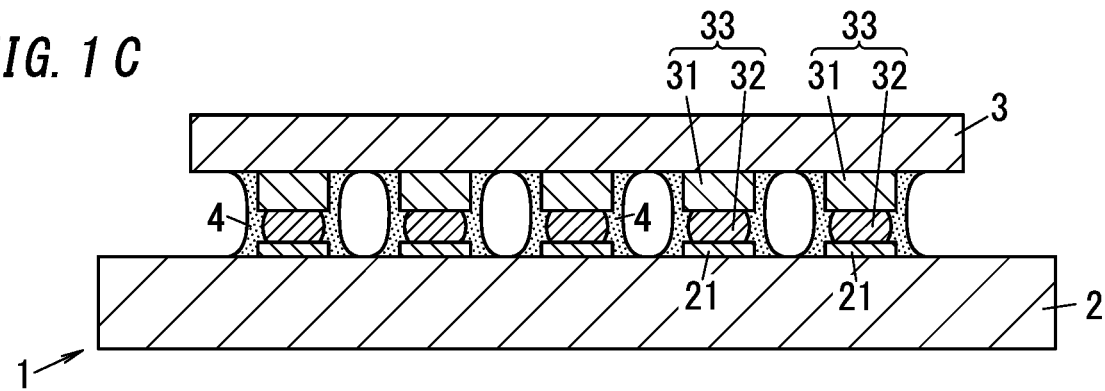
FIG. 1C is a cross-sectional view schematically illustrating a third example of a semiconductor device according to the exemplary embodiment of the present invention.

In the third example illustrated in FIG. 1C, the semiconductor device 1 includes a plurality of reinforcing members 4. Each reinforcing member 4 is provided for an associated bump electrode 33. The reinforcing member 4 covers the bump electrode 33 entirely and also covers the conductor wiring 21 partially. This allows the reinforcing members 4 to cover the bump electrodes 33 entirely and the seam between the bump electrodes 33 and the conductor wiring 21.

Figure 2A:
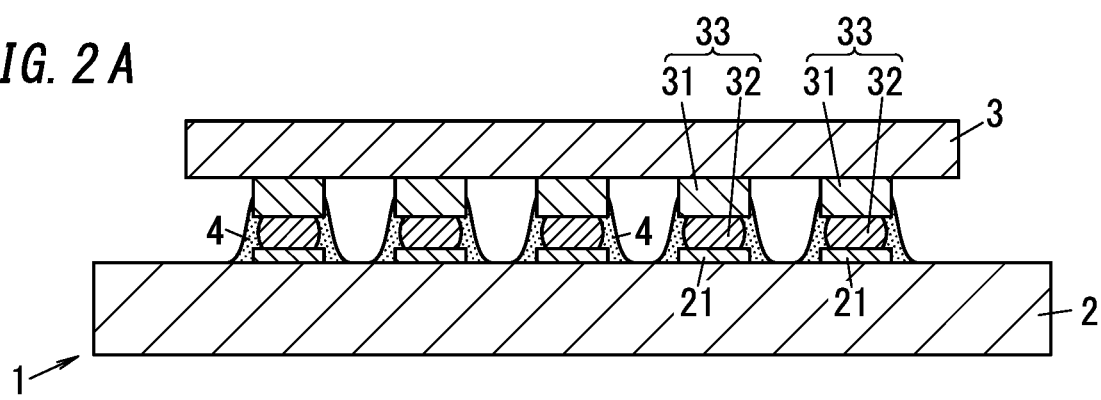
FIG. 2A is a cross-sectional view schematically illustrating a fourth example of a semiconductor device according to the exemplary embodiment of the present invention.
Figure 2B:
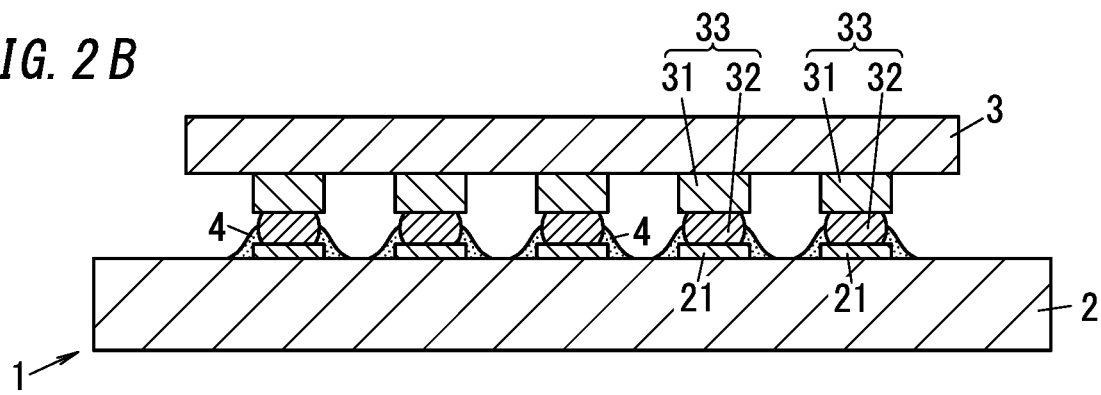
FIG. 2B is a cross-sectional view schematically illustrating a fifth example of a semiconductor device according to the exemplary embodiment of the present invention.

In each of the fourth example illustrated in FIG. 2A and the fifth example illustrated in FIG. 2B, the semiconductor device 1 also includes a plurality of reinforcing members 4. Each reinforcing member 4 is provided for an associated bump electrode 33. Each reinforcing member 4 covers the conductor wiring 21 entirely and also covers the part, bonded to the conductor wiring 21, of the associated bump electrode 33. This allows the reinforcing member 4 to cover the bump electrode 33 partially and also cover the seam between the bump electrode 33 and the conductor wiring 21. In the fourth example illustrated in FIG. 2A, each reinforcing member 4 entirely covers the solder bump 32 of its associated bump electrode 33. In the fifth example illustrated in FIG. 2B, each reinforcing member 4 partially covers the solder bump 32 of its associated bump electrode 33.

A method for fabricating the semiconductor device 1 includes the steps of:

providing the base member 2 including the conductor wiring 21 and the semiconductor chip 3 including the bump electrodes 33;

placing the semiconductor chip 3 over the base member 2 and placing the bump electrodes 33 on the conductor wiring 21;

arranging the Composition (X) such that the Composition (X) covers the bump electrodes 33; and subjecting the Composition (X) and the bump electrodes 33 to heating treatment and thereby curing the Composition (X) to form a reinforcing member 4 and electrically connect the bump electrodes 33 and the conductor wiring 21 together.

These steps do not have to be performed in this order. Specifically, after the semiconductor chip 3 has been placed over the base member 2 and the bump electrodes 33 have been placed on the conductor wiring 21, the Composition (X) may be arranged to cover the bump electrodes 33. Alternatively, after the Composition (X) has been arranged to cover the bump electrodes 33, the semiconductor chip 3 may be placed over the base member 2 and the bump electrodes 33 may be placed on the conductor wiring 21. Still alternatively, as long as the Composition (X) may be arranged to cover the bump electrodes 33 eventually during the manufacturing process, the Composition (X) may be arranged anywhere on the semiconductor chip 3 and the base member 2 at any timing.

Specifically, to form the reinforcing member(s) 4 shown in FIG. 1A, 1B, or 2B, after the Composition (X) has been arranged on the base member 2, the semiconductor chip 3 is placed over the base member 2 such that the Composition (X) is interposed between the base member 2 and the semiconductor chip 3 and that the bump electrodes 33 are placed on the conductor wiring 21. This allows the Composition (X) to be arranged first to cover the bump electrodes 33. Alternatively, after the semiconductor chip 3 has been placed over the base member 2 such that the bump electrodes 33 are placed on the conductor wiring 21, the Composition (X) may be fed into the gap between the base member 2 and the semiconductor chip 3 to interpose the Composition (X) between the base member 2 and the semiconductor chip 3 and to make the Composition (X) cover the bump electrodes 33.

To form the reinforcing member(s) 4 shown in FIG. 1A, 1C, 2A, or 2B, first, the Composition (X) is arranged on the semiconductor chip 3 to cover the bump electrodes 33, for example. Next, the semiconductor chip 3 is placed over the base member 2 such that the Composition (X) is interposed between the base member 2 and the semiconductor chip 3 and that the bump electrodes 33 are placed on the conductor wiring 21. This allows the Composition (X) to be arranged to cover the bump electrodes 33.

The Composition (X) may be arranged on either the base member 2 or the semiconductor chip 3 by a method using a dispenser, a screen-printing method, an inkjet method, or a dipping method, for example.

The heating treatment may be performed using a reflow furnace, for example. Alternatively, the heating treatment may also be performed by an appropriate method using any equipment other than the reflow furnace. When the Composition (X) and the bump electrodes 33 are subjected to the heating treatment, the solder in the bump electrodes 33 melts to electrically connect the bump electrodes 33 to the conductor wiring 21. In addition, the Composition (X) cures to form the reinforcing member 4. In this manner, the semiconductor device 1 is fabricated.

In the heating treatment, the highest heating temperature suitably falls within the range from 160° C. to 200° C. and the total of time periods in which the heating temperature is equal to or higher than 160° C. is suitably within the range from 40 seconds to 10 minutes. The highest heating temperature is more suitably 190° C. or less, even more suitably 180° C. or less. The heating time at the highest heating temperature is more suitably within the range from 1 minute to 2 minutes. In addition, the highest heating temperature is suitably higher than the temperature at which the curing reaction of the Composition (X) starts and equal to or less than the temperature corresponding to the maximum peak of the exothermic curve while the condition described above is satisfied. Even if the heating treatment is conducted under this condition, the Composition (X) has its viscosity decreased first to sufficiently fill the gap between the base member 2 and the semiconductor chip 3 and exhibit good wettability with respect to the bump electrodes 33, because the Composition (X) has the properties described above. Subsequently, the Composition (X) cures quickly, thus allowing the reinforcing member 4 obtained to achieve a high curing rate. Specifically, the reinforcing member 4 may achieve as high a curing rate as 70% or more. Furthermore, setting the highest heating temperature and heating time as described above reduces, even when the semiconductor device 1 has the configuration shown in FIG. 1A or 1B, the chances of the semiconductor device 1 having warpage due to a difference in thermal expansion coefficient between the base member 2, the semiconductor chip 3, and the reinforcing member 4 or applying a load to the semiconductor chip 3 due to the heat.

Figure 3:
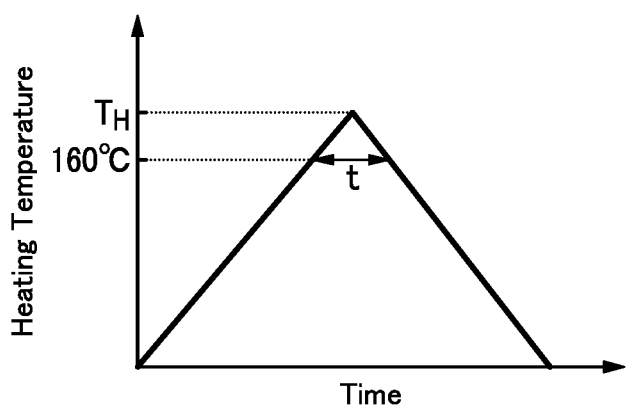
FIG. 3 is a graph showing an exemplary heating treatment condition when a reinforcing member is made of an electronic-part-reinforcing thermosetting resin composition according to the exemplary embodiment of the present invention, wherein the ordinate indicates the heating temperature and the abscissa indicates the time.

FIG. 3 shows an exemplary variation in heating temperature with time during the heating treatment. In FIG. 3, the ordinate indicates the heating temperature and the abscissa indicates the time. In this example, a temperature rising period and a temperature falling period are continuous with each other time-sequentially during the heating treatment. First, in the temperature rising period, the heating temperature rises from room temperature to the highest heating temperature (TH). The temperature increase rate of the heating temperature may fall within the range from 0.4° C./s to 4.0° C./s, for example. The highest heating temperature (Tx) suitably falls within the range from 160° C. to 200° C. as described above. Next, in the temperature falling period, the heating temperature falls from the highest heating temperature (Tx) to room temperature. In this heating treatment, the total (t) of the time periods in which the heating temperature is equal to or higher than 160° C. is within the range from 40 seconds to 10 minutes.

In the temperature rising period, first, the Composition (X) has its viscosity decreased to the point that the Composition (X) sufficiently fills the gap between the base member 2 and the semiconductor chip 3 and exhibits good wettability with respect to the bump electrodes 33. Also, voids may be present in the Composition (X) due to volatile components in the base member 2, low-molecular components in the Composition (X), or the water produced by the reaction between the flux and a metal oxide. However, since the Composition (X) has low viscosity, those voids tend to be exhausted quickly from the Composition (X). Subsequently, the curing reaction of the Composition (X) advances, thus allowing the Composition (X) to cure and forming the reinforcing member 4. Thereafter, in the temperature falling period, the heating temperature falls to room temperature to end the heating treatment.

EXAMPLES

1. Preparation of Composition

Among the various components shown in Tables 1 and 2, first, the components shown in the "Epoxy Resin" column were mixed together in an oven at 120° C. and then stirred up with a disper. Thereafter, the components shown in the "Curing Agent" column, the components shown in the "Flux" column, and a filler were added to the epoxy resin, and then these components were kneaded together using a beads mill under the condition including a beads diameter of 1.0 mm, a filling ratio of 80% or more, and a peripheral velocity of 100 rpm.

The details of the components shown in Tables 1 and 2 are as follows:

YDF-8170: bisphenol F type epoxy resin exhibiting liquid phase at 25° C., having an epoxy equivalent weight of 155 to 165 and a viscosity of 1000 to 1500 mPa·s at 25° C., manufactured by Nippon Steel & Sumikin Chemical, product number YDF-8170;

EPICLON 830: bisphenol F type epoxy resin exhibiting liquid phase at 25° C., having an epoxy equivalent weight of 165 to 177 and a viscosity of 3000 to 4000 mPa·s at 25° C., manufactured by DIC Corporation, product number EPICLON 830;

YL980: bisphenol A type epoxy resin exhibiting liquid phase at 25° C., having an epoxy equivalent weight of 180 to 190 and a viscosity of 10000 to 20000 mPa·s at 25° C., manufactured by Mitsubishi Chemical Corporation, product number YL980;

EPICLON 840: bisphenol A type epoxy resin exhibiting liquid phase at 25° C., having an epoxy equivalent weight of 180 to 190 and a viscosity of 9000 to 11000 mPa·s at 25° C., manufactured by DIC Corporation, product number EPICLON 840;

NC-3000: amorphous biphenyl aralkyl type epoxy resin exhibiting solid phase at 25° C., having an epoxy equivalent weight of 265 to 285, manufactured by Nippon Kayaku Corporation, product number NC-3000;

YX4000: crystalline biphenyl type epoxy resin exhibiting solid phase at 25° C., having an epoxy equivalent weight of 180 to 192, manufactured by Mitsubishi Chemical Corporation, product number YX-4000;

2P4MHZ: manufactured by Shikoku Chemicals Corporation, product number 2P4MHZ-PW, 2-pheyl-4-hydroxymethyl-5-methylimidazole;

2PHZ: manufactured by Shikoku Chemicals Corporation, product number 2PHZ-PW, 2-pheyl-4,5-dihydroxymethylimidazole;

Glutaric acid: manufactured by Tokyo Chemical Industry Co., Ltd.;

Sebacic acid: manufactured by Tokyo Chemical Industry Co., Ltd.; and

Filler: silica, manufactured by Nippon Aerosil Co., Ltd., product name AEROSIL 200.

2. Evaluation (1) Determination of temperature $T_{tp}$ and temperature $T_{hf}$ The composition was subjected to a differential scanning calorimetry using, as a calorimeter, EXSTAR 7020 manufactured by Hitachi High-Tech Science Corporation within the air atmosphere under the condition including a temperature range from 30° C. to 300° C. and a temperature increase rate of 10° C./min to obtain a DSC curve. Based on this DSC curve, the temperature $T_{tp}$ corresponding to the maximum peak of the exothermic curve and the temperature $T_{hf}$ corresponding to one half of the height of the maximum peak in the temperature rising range of the exothermic curve were determined. In Tables 1 and 2, shown are the values of the temperature $T_{tp}$, and the differential values ($T_{tp}-T_{hf}$) between the temperatures $T_{tp}$ and $T_{hf}$.

(2) Viscosity at 140° C.

The viscosity at 140° C. of the composition was measured using a rheometer (model number AR2000ex, manufactured by TA Instruments) under the condition including a rotational velocity of 5 rpm. When the composition turned out to have a viscosity of 5 Pa·s or less, the composition was rated a "go (G)." On the other hand, when the composition turned out to have a viscosity greater than 5 Pa·s, the composition was rated a "no-go (NG)."

(3) Wettability

The composition was put on a copper plate to form a film of a resin with a thickness of 0.1 mm Sn—Bi based solder with a melting point of 138° C. was formed into the shape of spheres with a diameter of 0.35 mm and placed on the film on the copper plate. Subsequently, the plate, as well as the film and the Sn—Bi based solder thereon, was heated at 160° C. for two minutes and then cooled to room temperature. Next, the diameter (D) and height (H) of the Sn—Bi based solder in a plan view were measured to obtain, based on the results, a value calculated by the equation $\{(D-H)/D\}\times 100(\%)$. This value was regarded as an index to wettability. When this value is 20% or more, the composition may be regarded as having wettability with respect to the solder. When the value is 30% or more, its wettability may be rated good. When the value is 40% or more, its wettability may be rated excellent.

(4) Curing Rate

The composition was formed into a film having a thickness of 100 μm and then subjected to a heating treatment in a reflow furnace. In the heating treatment, the temperature increase rate was 2° C./s, the highest heating temperature was 165° C., and the total of the time periods in which the heating temperature was equal to or higher than 160° C. was 1 minute. In this manner, a cured product was obtained.

This cured product was subjected to a differential scanning calorimetry (DSC) within the air atmosphere under the condition including a temperature range of 30° C. to 300° C. and a temperature increase rate of 10° C./min to measure the quantity of heat generated ($Cv_1$) by the cured product. In addition, the composition was subjected to a differential scanning calorimetry (DSC) under the same condition as the one described above to measure the quantity of heat generated ($Cv_1$) by the cured product. Based on these results, the curing rate (Hr) of the cured product was calculated by the equation $Hr=\{(Cv_0-Cv_1)/Cv_0\}\times 100(\%)$.

TABLE 1

| | | Examples | | | | | | | | |
|---|---|---|---|---|---|---|---|---|---|---|
| | | 1 | 2 | 3 | 4 | 5 | 6 | 7 | 8 | 9 |
| Epoxy resin (ratio by mass with respect to entire epoxy resin) | YDF-8170 | 10 | | 1 | 10 | 12 | | 2 | 12 | 10 |
| | EPICLON 830 | | 20 | | | | 20 | | | |
| | YL980 | 2 | | 1 | 2 | | | | | 2 |
| | EPICLON 840 | | 4 | | | | 4 | | | |
| | NC-3000 | 1 | | 1 | 1 | 1 | | 1 | 1 | 1 |
| | YX4000 | | 1 | | | | 1 | | | |
| Curing agent (ratio by mass with respect to entire epoxy resin) | 2P4MHZ | 0.1 | 0.1 | 0.3 | 0.1 | | | | | 0.1 |
| | 2PHZ | | | | | 0.1 | 0.1 | 0.3 | 0.1 | |
| Flux (ratio by mass with respect to entire epoxy resin) | Glutaric acid | 0.1 | 0.1 | 0.1 | 0.1 | | | | | 0.1 |
| | Sebacic acid | | | | | 0.1 | 0.1 | 0.1 | 0.1 | 0.05 |
| | Adipic acid | | | | | | | | | |

TABLE 1-continued

| | | | | | | | | | | |
|---|---|---|---|---|---|---|---|---|---|---|
| Filler (percentage by mass with respect to entire composition | | | | | 1% | | | 1% | | |
| Evaluation | Ttp (° C.) | 160 | 158 | 158 | 156 | 164 | 162 | 161 | 159 | 160 |
| | Ttp − Thf (° C.) | 3.7 | 4 | 3.4 | 3.2 | 5 | 6.2 | 4.8 | 4.6 | 3.7 |
| | Viscosity at 140° C. | G | G | G | G | G | G | G | G | G |
| | Wettability (%) | 50 | 35 | 42 | 25 | 48 | 33 | 40 | 25 | 56 |
| | Curing rate (%) | 84 | 82 | 90 | 84 | 84 | 88 | 90 | 83 | 83 |

| | | Examples | | | | | |
|---|---|---|---|---|---|---|---|
| | | 10 | 11 | 12 | 13 | 14 | 15 |
| Epoxy resin (ratio by mass with respect to entire epoxy resin) | YDF-8170 | | 1 | 10 | 12 | | 2 |
| | EPICLON 830 | 20 | | | | 20 | |
| | YL980 | | 1 | 2 | | | |
| | EPICLON 840 | 4 | | | | 4 | |
| | NC-3000 | | 1 | 1 | 1 | | 1 |
| | YX4000 | 1 | | | | 1 | |
| Curing agent (ratio by mass with respect to entire epoxy resin) | 2P4MHZ | 0.1 | 0.3 | 0.1 | | | |
| | 2PHZ | | | | 0.1 | 0.1 | 0.3 |
| Flux (ratio by mass with respect to entire epoxy resin) | Glutaric acid | 0.1 | 0.1 | 0.1 | 0.05 | 0.05 | 0.05 |
| | Sebacic acid | 0.05 | 0.05 | 0.05 | 0.1 | 0.1 | 0.1 |
| | Adipic acid | | | | | | |
| Filler (percentage by mass with respect to entire composition | | | | 1% | | | |
| Evaluation | Ttp (° C.) | 158 | 158 | 156 | 164 | 162 | 161 |
| | Ttp − Thf (° C.) | 4 | 3.4 | 3.2 | 5 | 6.2 | 4.89 |
| | Viscosity at 140° C. | G | G | G | G | G | G |
| | Wettability (%) | 41 | 48 | 30 | 50 | 35 | 42 |
| | Curing rate (%) | 81 | 89 | 83 | 83 | 87 | 89 |

TABLE 2

| | | Examples | | | | | | | | |
|---|---|---|---|---|---|---|---|---|---|---|
| | | 16 | 17 | 18 | 19 | 20 | 21 | 22 | 23 | 24 |
| Epoxy resin (ratio by mass with respect to entire epoxy resin) | YDF-8170 | 12 | 10 | | 1 | 10 | 12 | | 2 | 12 |
| | EPICLON 830 | | | 20 | | | | 20 | | |
| | YL980 | | 2 | | 1 | 2 | | | | |
| | EPICLON 840 | | | 4 | | | | 4 | | |
| | NC-3000 | 1 | 1 | | 1 | 1 | 1 | | 1 | 1 |
| | YX4000 | | | 1 | | | | 1 | | |
| Curing agent (ratio by mass with respect to entire epoxy resin) | 2P4MHZ | | 0.1 | 0.1 | 0.3 | 0.1 | | | | |
| | 2PHZ | 0.1 | | | | | 0.1 | 0.1 | 0.3 | 0.1 |
| Flux (ratio by mass with respect to entire epoxy resin) | Glutaric acid | 0.05 | 0.1 | 0.1 | 0.1 | 0.1 | | | | |
| | Sebacic acid | 0.1 | | | | | 0.1 | 0.1 | 0.1 | 0.1 |
| | Adipic acid | | | 0.05 | 0.05 | 0.05 | 0.05 | 0.05 | 0.05 | 0.05 |
| Filler (percentage by mass with respect to entire composition | | 1% | | | | 1% | | | | 1% |
| Evaluation | Ttp (° C.) | 159 | 160 | 158 | 158 | 156 | 164 | 162 | 161 | 159 |
| | Ttp − Thf (° C.) | 4.6 | 3.7 | 4 | 3.4 | 3.2 | 5 | 6.2 | 4.8 | 4.6 |
| | Viscosity at 140° C. | G | G | G | G | G | G | G | G | G |
| | Wettability (%) | 27 | 59 | 44 | 51 | 33 | 49 | 34 | 41 | 28 |
| | Curing rate (%) | 83 | 83 | 81 | 89 | 83 | 83 | 87 | 89 | 83 |

TABLE 2-continued

|  |  | Comparative examples | | | | | |
|---|---|---|---|---|---|---|---|
|  |  | 1 | 2 | 3 | 4 | 5 | 6 |
| Epoxy resin (ratio by mass with respect to entire epoxy resin) | YDF-8170 | 20 | 1 | 10 | 30 | 1 | 12 |
|  | EPICLON 830 | 20 |  |  |  | 20 |  |
|  | YL980 | 10 | 1 | 2 |  |  |  |
|  | EPICLON 840 |  |  |  |  |  |  |
|  | NC-3000 | 1 | 2 | 1 | 1 | 1 | 1 |
|  | YX4000 |  |  |  |  |  |  |
| Curing agent (ratio by mass with respect to entire epoxy resin) | 2P4MHZ | 0.1 | 0.1 | 0.1 |  |  |  |
|  | 2PHZ |  |  |  | 0.1 | 0.1 | 0.3 |
| Flux (ratio by mass with respect to entire epoxy resin) | Glutaric acid | 0.2 | 0.1 | 0.1 |  |  |  |
|  | Sebacic acid |  |  |  | 0.2 | 0.2 | 0.1 |
|  | Adipic acid |  |  |  |  |  |  |
| Filler (percentage by mass with respect to entire composition |  |  |  |  | 6% |  | 6% |
| Evaluation | Ttp (° C.) | 174 | 173 | 151 | 180 | 176 | 173 |
|  | Ttp − Thf (° C.) | 7.4 | 4.2 | 3 | 7.8 | 6.6 | 4.3 |
|  | Viscosity at 140° C. | G | NG | NG | G | NG | NG |
|  | Wettability (%) | 48 | 15 | 10 | 48 | 52 | 10 |
|  | Curing rate (%) | 56 | 43 | 88 | 56 | 43 | 88 |

The invention claimed is:

1. An electronic-part-reinforcing thermosetting resin composition having:
a viscosity of 5 Pa·s or less at 140° C.;
a temperature of 150° C. to 170° C. as a temperature corresponding to a maximum peak of an exothermic curve representing a curing reaction; and
a difference of 20° C. or less between the temperature corresponding to the maximum peak and a temperature corresponding to one half of the height of the maximum peak in a temperature rising range of the exothermic curve,
the resin composition turning into a cured product having a curing rate of 60% or more when subjected to a heating treatment under at least one condition that the highest heating temperature falls within a range from 160° C. to 200° C. and a total of time periods in which a heating temperature is equal to or higher than 160° C. is within a range from 40 seconds to 10 minutes.

2. The electronic-part-reinforcing thermosetting resin composition of claim 1, wherein
the temperature corresponding to one half of the height of the maximum peak in the temperature rising range of the exothermic curve falls within a range from 140° C. to 168° C.

3. The electronic-part-reinforcing thermosetting resin composition of claim 1, containing
a bisphenol type epoxy resin exhibiting a liquid phase at 25° C.; and
at least one compound selected from the group consisting of: 2-phenyl-4-hydroxymethyl-5-methylimidazole, 2-phenyl-4,5-dihydroxymethylimidazole, and 2,4-diamino-6-(2'-ethyl-4'-methylimidazol)-ethyl-s-triazine.

4. The electronic-part-reinforcing thermosetting resin composition of claim 3, further containing a solid epoxy resin.

5. The electronic-part-reinforcing thermosetting resin composition of claim 1, further containing a flux.

6. The electronic-part-reinforcing thermosetting resin composition of claim 1, either containing no fillers or having a filler content greater than 0% by mass and equal to or less than 5% by mass.

7. A semiconductor device comprising:
a base member including conductor wiring;
a semiconductor chip including a bump electrode, the semiconductor chip being mounted on the base member by having the bump electrode bonded onto the conductor wiring; and
a reinforcing member covering the bump electrode,
the reinforcing member being a cured product of the electronic-part-reinforcing thermosetting resin composition of claim 1.

8. A method for fabricating a semiconductor device, the method comprising:
providing a base member including conductor wiring and a semiconductor chip including a bump electrode;
placing the semiconductor chip over the base member and placing the bump electrode on the conductor wiring;
arranging an electronic-part-reinforcing thermosetting resin composition having:
a viscosity of 5 Pa s or less at 140° C.;
a temperature of 150° C. to 170° C. as a temperature corresponding to a maximum peak of an exothermic curve representing a curing reaction; and
a difference of 20° C. or less between the temperature corresponding to the maximum peak and a temperature corresponding to one half of the height of the maximum peak in a temperature rising range of the exothermic curve
such that the electronic-part-reinforcing thermosetting resin composition covers the bump electrode: and
subjecting the electronic-part-reinforcing thermosetting resin composition and the bump electrode to heating treatment and thereby curing the electronic-part-reinforcing thermosetting resin composition to form a reinforcing member and electrically connect the bump electrode and the conductor wiring together,
wherein during the heating treatment, the highest heating temperature falls within a range from 160° C. to 200° C. and a total of time periods in which a heating temperature is equal to or higher than 160° C. is within a range from 40 seconds to 10 minutes.

* * * * *